(12) United States Patent
Tomiyoshi

(10) Patent No.: US 8,471,479 B2
(45) Date of Patent: Jun. 25, 2013

(54) ILLUMINATION DEVICE AND DISPLAY DEVICE USING THE SAME

(75) Inventor: Akira Tomiyoshi, Osaka (JP)

(73) Assignee: Sharp Kabushiki Kaisha, Osaka (JP)

(*) Notice: Subject to any disclaimer, the term of this patent is extended or adjusted under 35 U.S.C. 154(b) by 739 days.

(21) Appl. No.: 12/670,916

(22) PCT Filed: Feb. 20, 2008

(86) PCT No.: PCT/JP2008/052860
§ 371 (c)(1),
(2), (4) Date: Jan. 27, 2010

(87) PCT Pub. No.: WO2009/016852
PCT Pub. Date: Feb. 5, 2009

(65) Prior Publication Data
US 2010/0194271 A1    Aug. 5, 2010

(30) Foreign Application Priority Data
Jul. 27, 2007   (JP) ................. 2007-196094

(51) Int. Cl.
*H01J 1/00* (2006.01)
(52) U.S. Cl.
USPC ...................... 315/169.3; 313/500
(58) Field of Classification Search
USPC .............. 362/368, 373, 294; 313/483, 500, 313/498; 315/169.1, 169.3
See application file for complete search history.

(56) References Cited

U.S. PATENT DOCUMENTS

| | | | |
|---|---|---|---|
| 6,274,978 B1 * | 8/2001 | Roach et al. | ................. 313/483 |
| 7,242,585 B2 | 7/2007 | Fukuma et al. | |
| 7,375,381 B2 * | 5/2008 | Shimizu et al. | ................. 257/98 |
| 7,470,055 B2 | 12/2008 | Hacker et al. | |
| 7,808,580 B2 | 10/2010 | Song et al. | |
| 7,880,831 B2 | 2/2011 | Hsiao | |
| 7,936,415 B2 | 5/2011 | Park | |
| 7,967,490 B2 | 6/2011 | Kim et al. | |
| 2005/0265051 A1 | 12/2005 | Yamamoto et al. | |
| 2006/0077629 A1 | 4/2006 | Shiraishi | |
| 2006/0092346 A1 | 5/2006 | Moon et al. | |
| 2006/0133090 A1 | 6/2006 | Noh et al. | |
| 2006/0289201 A1 | 12/2006 | Kim et al. | |

(Continued)

FOREIGN PATENT DOCUMENTS

| | | |
|---|---|---|
| CN | 1758839 A | 4/2006 |
| CN | 101688650 A | 3/2010 |

(Continued)

OTHER PUBLICATIONS

Office Action mailed Jan. 4, 2012 in U.S. Appl. No. 12/670,758 (9 pages).

(Continued)

*Primary Examiner* — David H Vu
(74) *Attorney, Agent, or Firm* — Nixon & Vanderhye P.C.

(57) ABSTRACT

An illumination device (4) includes a light-emitting diode (light-emitting element) (9) and an LED substrate (light source substrate) (8) including a mounting surface (8a) on which the light-emitting diode (9) is mounted. A plurality of the light-emitting diodes (9) are mounted on the mounting surface (8a) of the LED substrate (8) and an LED driver (driving circuit element) (11) for driving the light-emitting diodes (9) is provided on the backside (8b) of the mounting surface (8a).

8 Claims, 10 Drawing Sheets

U.S. PATENT DOCUMENTS

| | | |
|---|---|---|
| 2007/0002590 A1 | 1/2007 | Jang et al. |
| 2007/0013647 A1 | 1/2007 | Lee et al. |
| 2007/0014098 A1 | 1/2007 | Park et al. |
| 2007/0041190 A1 | 2/2007 | Chou |
| 2009/0174840 A1 | 7/2009 | Lee et al. |

FOREIGN PATENT DOCUMENTS

| | | |
|---|---|---|
| DE | 10 2006 033 894 A1 | 6/2007 |
| JP | 2000-030521 | 1/2000 |
| JP | 2000-151056 | 5/2000 |
| JP | 2002-163912 | 6/2002 |
| JP | 2002-299700 | 10/2002 |
| JP | 2004-186004 | 2/2004 |
| JP | 2005-129734 | 5/2005 |
| JP | 2005-316337 | 11/2005 |
| JP | 2005-317480 | 11/2005 |
| JP | 2006-269140 | 10/2006 |
| JP | 2006-301209 | 11/2006 |
| JP | 2006-302581 | 11/2006 |
| JP | 2006-331969 | 12/2006 |
| JP | 2007-66879 | 3/2007 |
| JP | 2007-87662 | 4/2007 |
| JP | 2007-109447 | 4/2007 |
| JP | 2007-134459 | 5/2007 |
| RU | 2 267 053 C2 | 12/2005 |
| RU | 64321 U1 | 6/2007 |
| SU | 962684 A1 | 9/1982 |

OTHER PUBLICATIONS

English Translation of the Russian Office Action (Decision to Grant) mailed Dec. 9, 2011 in Russian application 2010102528.

U.S. Appl. No. 12/670,758, filed Jan. 26, 2010, entitled Illumination Device and Display Device Using the Same.

Supplementary European Search Report mailed May 19, 2010 in EP application 08711666.1.

Supplementary European Search Report mailed May 4, 2010 in EP application 08711669.5.

International Search Report for PCT/JP2008/052860, mailed Apr. 1, 2008.

Chinese Office Action mailed Sep. 2, 2010 in corresponding CN application 200880022873.5.

English translation of the Russian Office Action mailed Jun. 3, 2011 in Russian Application No. 2010102528.

* cited by examiner

ILLUMINATION DEVICE AND DISPLAY DEVICE USING THE SAME

This application is the U.S. national phase of International Application No. PCT/JP2008/052860, filed 20 Feb. 2008, which designated the U.S. and claims priority to Japanese Patent Application No. 2007-196094, filed 27 Jul. 2007, the entire contents of each of which are hereby incorporated by reference.

TECHNICAL FIELD

The present invention relates to an illumination device used for a backlight or the like and to a display devise using the illumination device.

BACKGROUND ART

Recently, for example, a liquid crystal display device has been used widely in a liquid crystal television, a monitor, a mobile telephone, and the like as a flat panel display having advantages such as smaller thinness and lighter weight compared with those of conventional Braun tubes. Such a liquid crystal display device includes an illumination device emitting light and a liquid crystal panel displaying a desired image by playing a role as a shutter with respect to light from a light source provided in the illumination device.

Furthermore, as the above-mentioned illumination device, an edge-light type device or a direct-type device has been provided, in which a linear light source composed of a cold cathode-ray tube or a hot cathode-ray tube is placed on the side of or below a liquid crystal panel. However, the cold cathode-ray tube and the like as described above contain mercury, so that it used to be difficult to recycle the cold cathode-ray tube to be discarded. Then, an illumination device using a light-emitting diode (LED) without using mercury as a light source has been proposed (see, for example, JP 2006-128125 A).

Further, in the conventional illumination device described in Patent document 1, it is shown that a plurality of driving elements for driving light-emitting diodes are placed on a mounting surface of a printed circuit board on which a plurality of light-emitting diodes are also mounted. According to this conventional illumination device, it has been concluded that the productivity of the illumination device can be improved by placing the plurality of light-emitting diodes and the plurality of driving elements on one printed circuit board.

DISCLOSURE OF INVENTION

Problem to be Solved by the Invention

In the above-mentioned illumination device, in order to address the enlargement of a screen and the increase in luminance in the liquid crystal display device, there is a demand for increasing the number of light-emitting diodes to be placed. Particularly, in a high-end product such as a liquid crystal television capable of receiving digital broadcasting, it is an indispensable condition to enhance luminance and the like by increasing the number of light-emitting diodes to be placed, so that there is a strong demand for increasing the placing number.

However, in the above-mentioned conventional illumination device, since the plurality of light-emitting diodes (light-emitting elements) and the plurality of driving elements (driving circuit elements) are mounted on the mounting surface of one printed circuit (light source substrate), heat generated by each of the light-emitting diodes and heat generated by each of the driving elements interact with each other, causing a significant increase in ambient temperature of each of the light-emitting diodes due to the heat from the driving elements. As a result, in this conventional illumination device, a desired light-emitting amount cannot be obtained in some cases due to a decrease in light-emitting efficiency of each of the light-emitting diodes. In particular, when the number of light-emitting diodes to be placed is increased, making improvements to the light-emitting quality may become extremely difficult as the light-emitting amount of each of the light-emitting diodes declines significantly. Therefore, the illumination device may not be able to support the above-mentioned high-end product.

With the foregoing in mind, it is an object of the present invention to provide an illumination device whose light-emitting quality can be improved even when the number of light-emitting elements to be placed is increased and a display device using the illumination device.

Means for Solving Problem

In order to achieve the above object, the illumination device according to the present invention is an illumination device that a light-emitting element and a light source substrate including a mounting surface on which the light-emitting element is mounted. A plurality of light-emitting elements are provided on the mounting surface of the light source substrate, and a driving circuit element for driving the light-emitting elements is provided on a backside of the mounting surface.

In the light source substrate in the illumination device having the above configuration, the plurality of light-emitting elements and the driving circuit element are respectively provided on the mounting surface and the backside in a distributed manner. Thus, even when the number of light-emitting diodes to be placed is increased, unlike the prior art illumination device, it is possible to prevent heat generated by the light-emitting elements and heat generated by the driving circuit element from interacting with each other. Thus, an increase in ambient temperature of each light-emitting element due to the heat from the driving circuit element can be prevented. As a result, unlike the prior art illumination device, it is possible to prevent the light-emitting efficiency of each light-emitting element from dropping and the light-emitting quality can be improved.

In the above-described illumination device, it is preferable that a plurality of rows of light-emitting elements are provided on the mounting surface of the light source substrate, the plurality of rows of light-emitting elements including the plurality of light-emitting elements arranged along a predetermined direction at a predetermined spacing, and the driving circuit element for driving the light-emitting elements is provided on the backside of the mounting surface so as to be disposed between the plurality of rows of light-emitting elements.

In this case, it is possible to prevent with mote certainty heat generated by the light-emitting elements and heat generated by the driving circuit element from interacting with each other, so that the light-emitting quality of the illumination device can be improved with ease. Further, in each row of light-emitting elements, the plurality of light-emitting elements are placed along a predetermined direction at a predetermined spacing. Thus, it is possible to prevent the occurrence of unevenness in luminance of light emitted by the illumination device.

Further, it is preferable that the above-described illumination device further includes a chassis for containing the light source substrate, a radiation portion for dissipating heat generated by the light-emitting diodes is provided on the backside of the light source substrate, and heat from the radiation portion is dissipated to outside through the chassis.

In this case, since the radiation portion transmits heat generated by the light-emitting elements from the mounting surface side to the back surface side, the heat can be efficiently dissipated to the outside.

Further, in the above-described illumination device, a heat transfer member is provided between the chassis and the radiation portion.

In this case, heat generated by the light-emitting elements can be efficiently dissipated to the outside.

Further, in the above-described illumination device, the heat transfer member is preferably provided with elasticity.

In this case, the heat transfer member comes in to surface-to-surface contact with the chassis and the radiation portion due to the provided elasticity. Thus, heat generated by the light-emitting elements can be transferred to the chassis side with certainty and the heat can be dissipated to the outside.

Further, in the above-described illumination device, the heat transfer member may be provided with adhesion.

In this case, the heat transfer member stability comes in to surface-to-surface contact with the chassis and the radiation portion due to the provided adhesion. Thus, heat generated by the light-emitting elements can be transferred to the chassis side with more certainty and the heat can be dissipated to the outside.

Further, in the above-described illumination device, the light-emitting elements may be light-emitting diodes.

In this case, an illumination device with low power consumption and excellent eco-friendliness can be achieved with ease.

Further, in the above-described illumination device, a plurality of types of light-emitting diodes whose emission light colors are different from each other but can be mixed into white light may be used for the light-emitting elements.

In this case, the color purities of emission light by the plurality of types of light-emitting diodes can be improved, and an illumination device having excellent light emitting quality can be achieved with ease.

Further in the above-described illumination device, it is preferable that a plurality of types of light-emitting diodes whose emission light colors are different from each other are used for the light-emitting elements, a plurality of sets of light-emitting diodes whose emission light colors can be mixed into white light are included, and the plurality of sets of light-emitting diodes are placed on the mounting surface along the predetermined direction and at a predetermined spacing.

In this case, by illuminating the light-emitting diodes emits by the set of light-emitting diodes, an illumination device capable of performing area active backlight drive that can support a high-performance display device can be achieved.

Further, the display device of the present invention is a display device including a display portion. The display portion is irradiated with light by any one of the above-mentioned illumination devices.

The display device configured as above uses an illumination device whose light-emitting quality can be improved even when the number of light-emitting elements to be placed is increased. Thus, a high-performance display device having high luminance and excellent display quality can be achieved with ease.

Effects of the Invention

According to the present invention, it is possible to provide an illumination device whose light-emitting quality can be improved even when the number of light-emitting elements to be placed is increased and a display device using the illumination device.

DESCRIPTION OF THE INVENTION

Hereinafter, a preferred embodiment of the illumination device and the display device using the illumination device of the present invention will be described with reference to the drawings. In the following description, a case where the present invention is applied to a transmissive liquid crystal display device will be described as an example. Further, the dimensions of the components in each of the drawings do not necessarily indicate the actual dimensions of the components and dimensional ratios among the respective components and the like.

Figure 1:
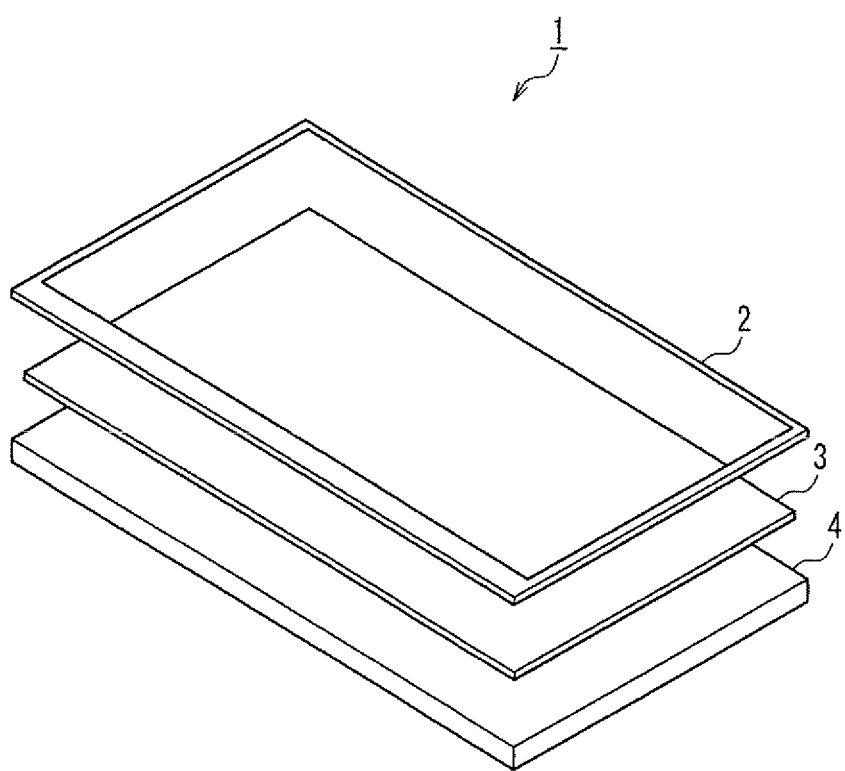
FIG. 1 is an exploded perspective view showing a liquid crystal display device using an illumination device according to one embodiment of the present invention.
Figure 2:
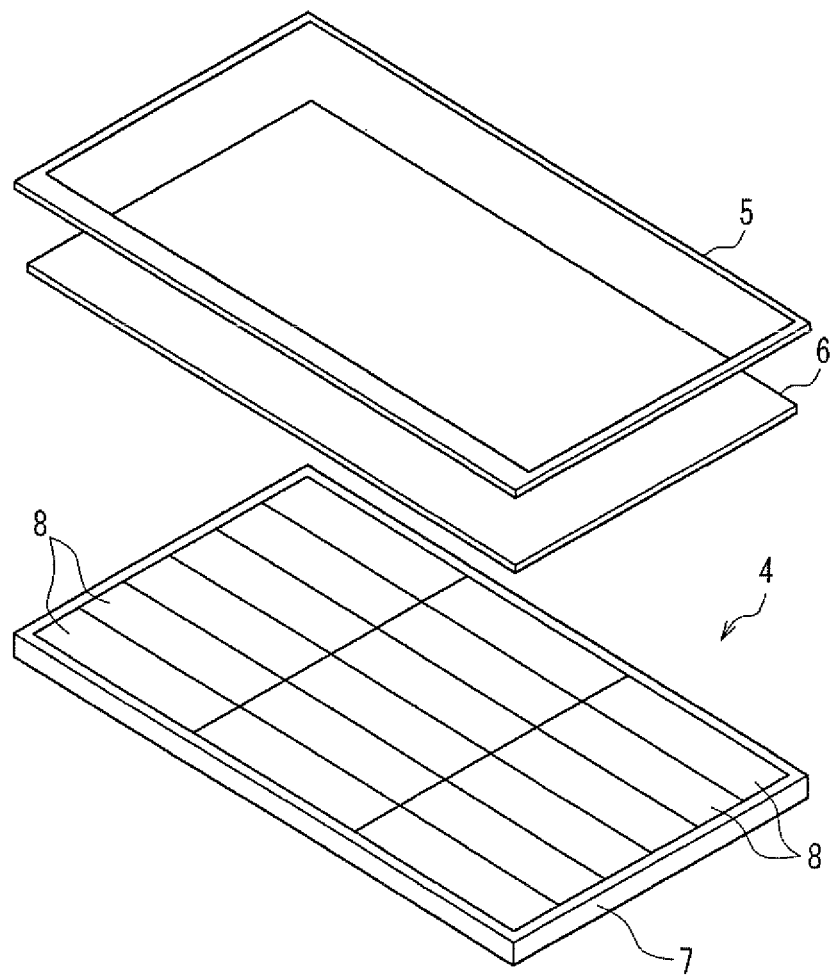
FIG. 2 is an exploded perspective view showing the illumination device.

FIG. 1 is an exploded perspective view showing a liquid crystal display device using an illumination device according to one embodiment of the present invention. FIG. 2 is an exploded perspective view showing the illumination device. In FIG. 1, a liquid crystal display device 1 includes a front frame 2, a liquid crystal panel 3 and an illumination device 4 of the present invention. The liquid crystal panel 3 and the illumination device 4 are placed behind the front frame 2 in this order. The front frame 2 encloses a display surface of the liquid crystal panel 3. In the liquid crystal panel 3, a transmissive liquid crystal display element (not shown) including a liquid crystal layer and a pair of polarizers between which the liquid crystal layer is interposed is used. Further, the liquid crystal panel 3 forms a display portion to which plane light (illumination light) is emitted from the illumination device 4. In present embodiment, the liquid crystal panel 3 and the illumination device 4 are integrated into the transmissive liquid crystal display device 1.

Also with reference to FIG. 2, the illumination device 4 includes a frame 5 enclosing a light-emitting surface of the illumination device 4, an optical sheet 6 and a chassis 7 containing light-emitting diode substrates (herein after referred to as "LED substrates") as light source substrates on which light-emitting diodes as light-emitting elements (light sources) are mounted. The optical sheet 6 and the chassis 7 are placed behind the frame 5 in this order. The optical sheet 6 includes a known optical sheet material, such as a polarization sheet, a prism (light-gathering) sheet or a diffusion sheet, as needed. For example, the luminance of the illumination light from the illumination device 4 is appropriately increased by the optical sheet 6 so as to improve the display performance of the liquid crystal panel 3.

Further, in the liquid crystal display device 1, a plurality of display areas and a plurality of illumination areas are set on the display surface of the liquid crystal panel 3 and the light-emitting surface of the illumination surface of the illumination device 4, respectively. And in the liquid crystal display device 1, backlight scan drive in which a plurality of light-emitting diodes are illuminated in sequence in accordance with information displayed on the liquid crystal panel 3 and area active backlight drive in which light-emitting diodes are illuminated by the illumination area are performed at the same time (described later in detail).

Here, the display areas in the liquid crystal panel 3 and the illumination areas in the illumination device 4 will be described in detail with reference to FIG. 3.

Figure 3:
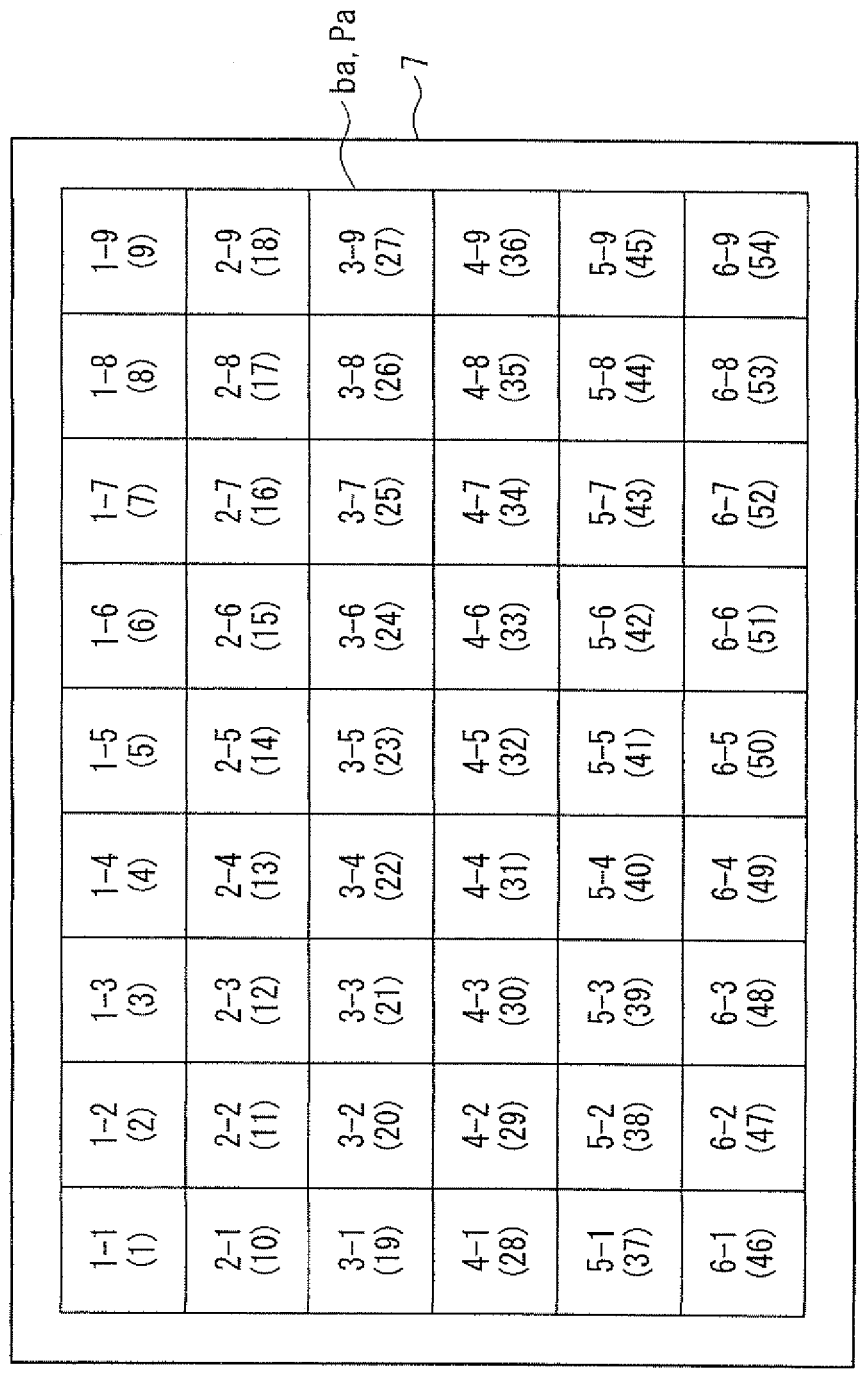
FIG. 3 is a diagram for explaining illumination areas and display areas set in the liquid crystal display device.

FIG. 3 is a diagram for explaining a specific example of the illumination areas and the display areas set in the liquid crystal display device 1.

As shown in FIG. 3, in the illumination device 4, a total of 54 illumination areas 1-1, 1-2, . . . , 6-8 and 6-9 (hereinafter, collectively referred to as "ba") are formed on the light-emitting surface (the surface of the optical sheet 6 enclosed by the frame 5 and facing the liquid crystal panel 3 side) in a 6 by 9 matrix so as to face the liquid crystal panel 3. In other words, with regard to the illumination areas ba, for example, nine illumination areas ba are set along the direction parallel to the horizontal direction of the display surface of the liquid crystal panel 3 and six illumination areas ba are set along the direction parallel to the vertical direction of the display surface.

Further, the illumination areas 1-1, 1-2, . . . , 6-8 and 6-9 allow light beams from sets of light-emitting diodes described later to respectively enter 54 display areas (1), (2), . . . (53) and (54) (hereinafter, collectively referred to as "pa") formed on the display surface of the liquid crystal panel 3. Each display area pa includes a plurality of pixels. In the liquid crystal display device 1, the illumination areas ba and the display areas pa essentially have a one-to-one relationship as described above, and an area active backlight in which one illumination area ha appropriately irradiates one display area pa with illumination light in accordance with information to be displayed is configured. Thus, in the liquid crystal display device 1, by independently controlling the plurality of illumination areas ba and the plurality of display areas pa, not only that the contrast on the display surface can be expanded but also the moving picture performance can be improved.

Although the drawing in FIG. 3 is divided by the vertical and horizontal lines in order to clearly show each of the illumination areas ba and the display areas pa, in reality, the illumination area ba and the display area pa are not divided by demarcation lines, partition members or the like. However, partition members may be provided, for example, on top of the chassis 7 to partition the illumination area ha into respective areas.

Next, the illumination device 4 will be described in detail with reference to FIGS. 4 to 7.

Figure 4:
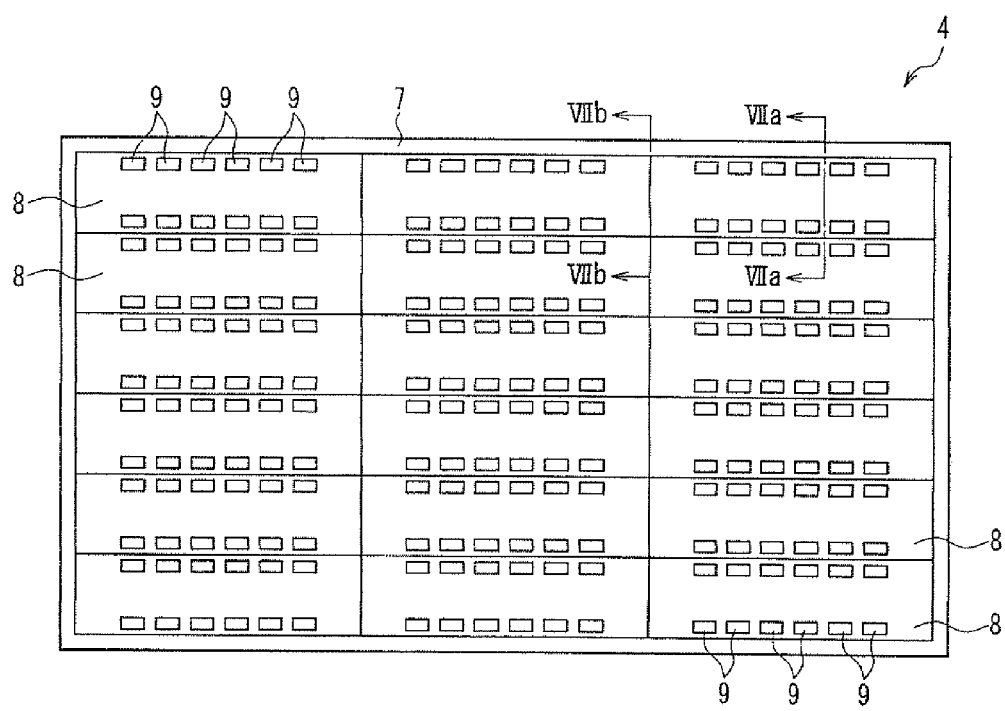
FIG. 4 is a plan view showing main components of the illumination device.
Figure 5A:
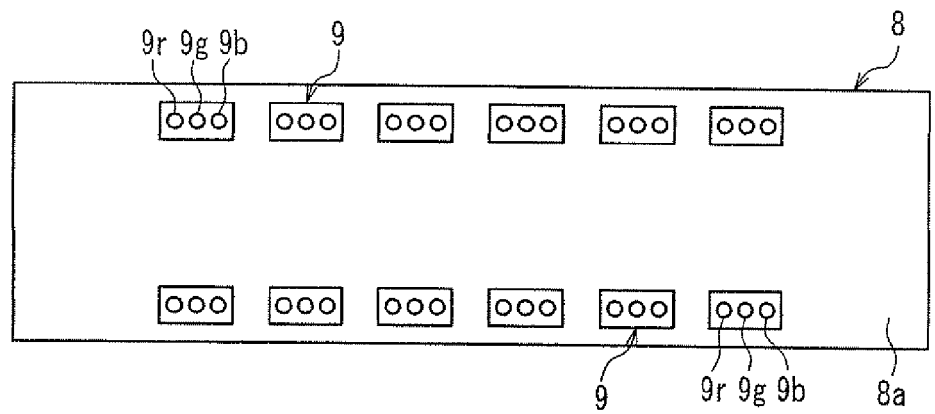
FIGS. 5A to 5C are diagrams for explaining the configuration of the LED substrate shown in FIG. 4, and FIGS. 5A, 5B and 5C show a mounting surface, a back surface and a side surface of the LED substrate, respectively.
Figure 5B:
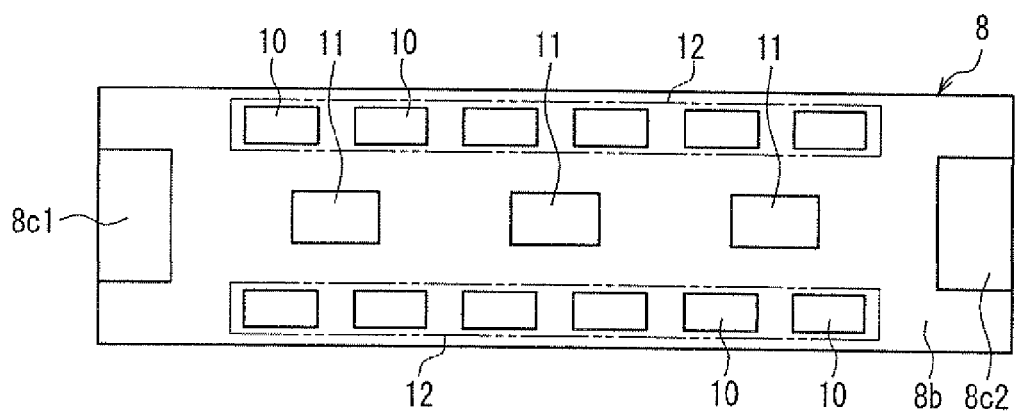
Figure 5C:
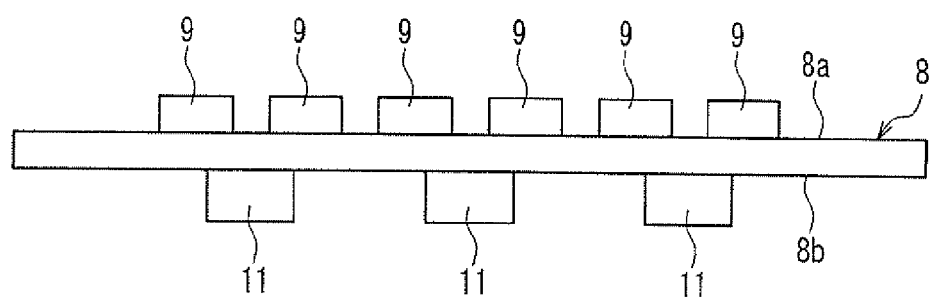
Figure 6:
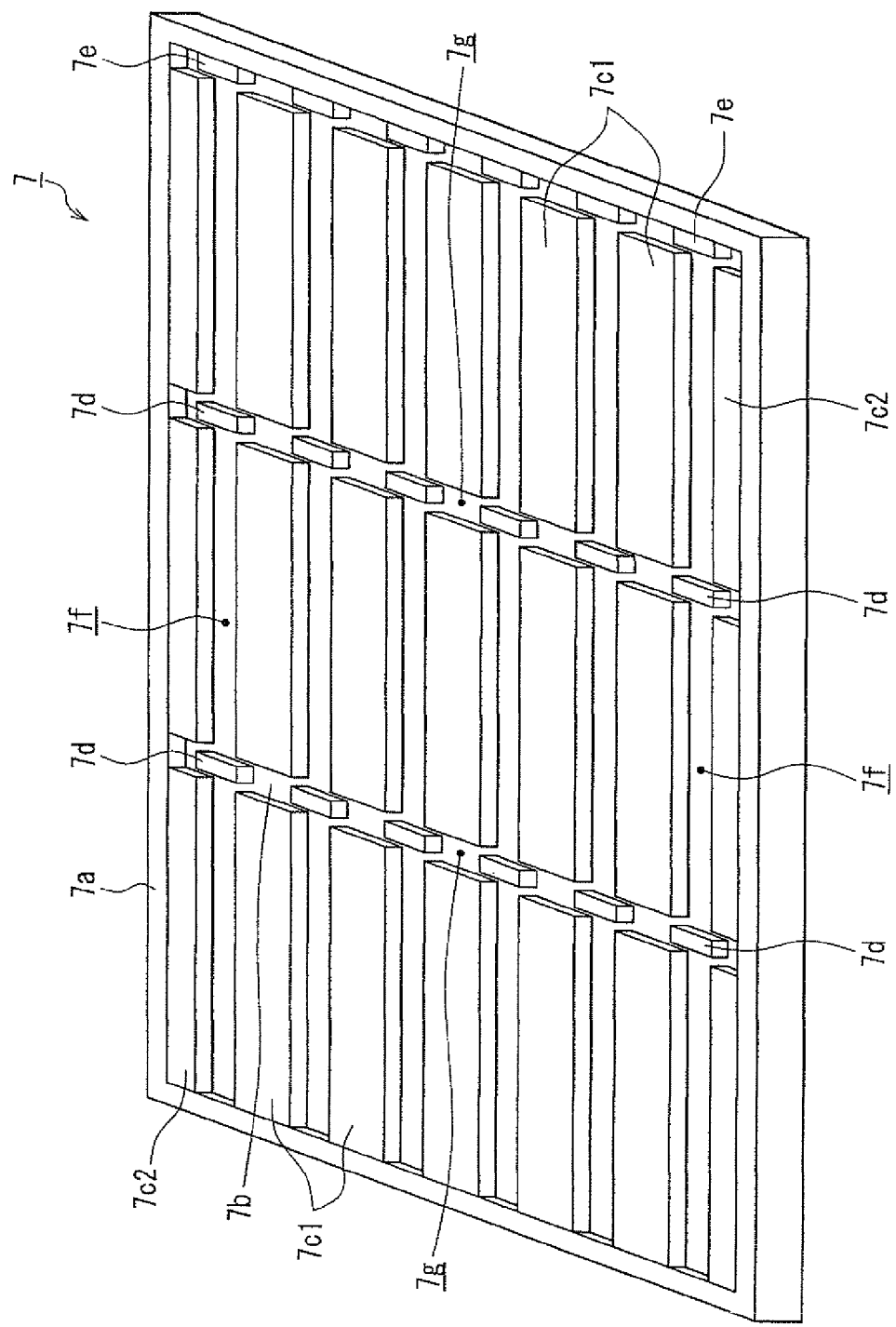
FIG. 6 is a perspective view showing the chassis shown in FIG. 4.
Figure 7A:
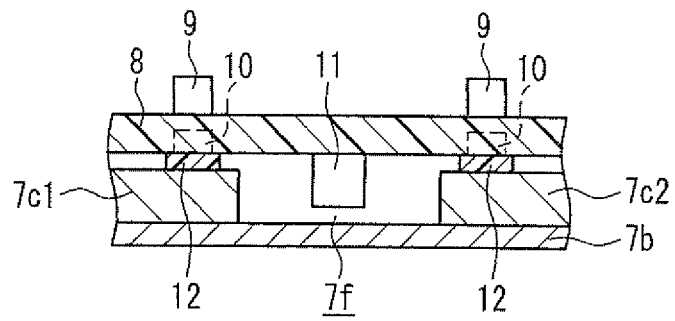
FIG. 7A is a cross-sectional view taken along the line VIIa-VIIa in FIG. 4
Figure 7B:
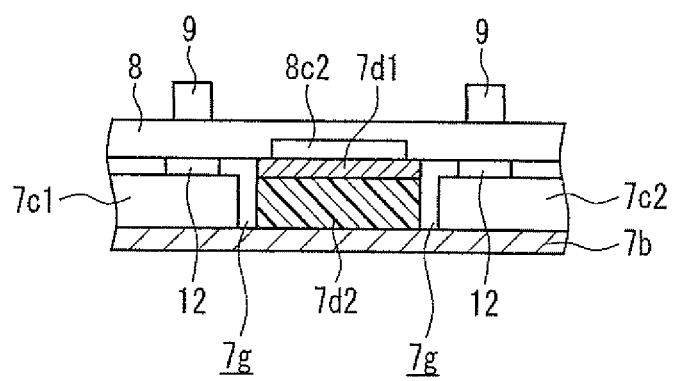
FIG. 7B is a cross-sectional view taken along a line VIIb-VIIb in FIG. 4.

FIG. 4 is a plan view showing main components of the illumination device 4. FIGS. 5A to 5C are diagrams for explaining the configuration of the LED substrate 8 shown in FIG. 4. FIGS. 5A, 5B and 5C show a mounting surface 8a, a back surface 8b and a side surface of the LED substrate 8, respectively. FIG. 6 is a perspective view showing the chassis 7 shown in FIG. 4. FIG. 7A is a cross-sectional view taken along the line VIIa-VIIa in FIG. 4 and FIG. 7B is a cross-sectional view taken along the line VIIb-VIIb in FIG. 4.

As shown in FIG. 4, in the illumination device 4, rectangular LED substrates 8, three along the horizontal direction and six along the vertical direction of FIG. 4, are provided within the chassis 7. As will be described later in detail, the LED substrates 8 are contained in the chassis 7 in such a state that horizontally adjacent LED substrates 8 are electrically connected to each other. In other words, six rows of LED substrate groups, each group composed of three LED substrates 8 that are electrically connected to each other, are formed in the chassis 7. On each LED substrate 8, two rows of light-emitting diodes each row including a plurality of, for example, six light-emitting diodes 9 arranged in line are provided, and a total of twelve light-emitting diodes 9 are placed. It is to be noted that, in the illumination device 4, the number of the LED substrates 8 to placed, and the number, type and size of the light-emitting diodes 9 to be placed are selected appropriately in accordance with the size of the liquid crystal panel 3 and the display performance such as luminance and display quality required by the liquid crystal display panel 3.

Specifically, as shown in FIG. 5, on the mounting surface 8a of the LED substrate 8, 3-in-1 light-emitting diodes each including red, green and blue light-emitting diodes 9r, 9g and 9b that respectively emit red (R), green (G) and blue (B) light beams are used for the light-emitting diodes 9. In each 3-in-1 light-emitting diode 9, a plurality of types of light-emitting diodes whose emission light colors are different from each other are used, and they form the above-mentioned set of light-emitting diodes whose emission light colors can be blend into white light. Furthermore, with regard to the LED substrate 8a, a total of four light-emitting diodes 9, two vertically adjacent diodes and two horizontally adjacent diodes, are assigned to each of the 54 illumination areas ba.

Further, as shown in FIG. 5A, two rows of light-emitting diodes are placed on the mounting source 8a so as to be parallel to each other in the horizontal direction. Furthermore, each row of light-emitting diodes includes six light-emitting diodes 9, which are provided along a predetermined direction (horizontal direction) at a predetermined spacing. Thus, since unevenness in luminance of illumination light to the liquid crystal panel 3 can be prevented easily in the illumination device 4, the light-emitting quality of the illumination device 4 can be improved with ease.

Further, as shown in FIG. 5B, in the LED substrate 8, radiation patterns 10 as radiation portions for dissipating heat generated by the light-emitting diodes 9 are placed on the back surface 8b of the mounting surface 8a by the light-emitting diode 9. In other words, the radiation patterns 10 are each placed on the position directly behind (directly under) the corresponding light-emitting diode 9, and heat from the light-emitting diodes 9 is efficiently transferred to the radiation patterns 10 through through holes or the like formed in the LED substrate 8 from the mounting surface 8a side to the back surface 8b side.

Further, heat transfer tape 12 as a heat transfer member for transferring heat from the radiation patterns 10 to the chassis 7 side is attached to the back surface 8b of the LED substrate 8 along the horizontal direction and the heat transfer tape 12 is placed by the row of radiation patterns including six radiation patterns 10 arranged in line. A belt-shaped synthesis resin adhesive having high heat conductivity, such as acrylic resin, is used for the heat transfer tape 12, and the heat transfer tape 12 is placed so as to cover each row of heat radiation patterns. The heat transfer tape 12 transfers heat generated by the light-emitting diodes 9 to the chassis 7 side and dissipates the heat to the outside (described later in detail).

Further, for example, three LED drivers 11 are mounted on the back surface 8b of the LED substrate 8 so as to be disposed between the two rows of radiation patterns, in other words, between the two rows of light-emitting diodes mounted on the mounting surface 8a. Each of these LED drivers 11 is a driving circuit element for driving the light-emitting diodes 9, midis composed of an IC in which given electronic components such as a constant-current circuit for supplying a constant current to the light-emitting diodes 9, a resistance element and a capacitor are integrated. Further, each LED driver 11 is electronically connected to four light-emitting diodes 9 through through holes formed in the LED substrate 8 and individually drives the four light-emitting diodes 9 connected thereto on the basis of an instruction signal from an illumination control portion described later. In this way, the light-emitting diodes 9 and the LED drivers 11 both as heat generating sources are mounted separately on the mounting surface 8a and the back surface 8b of the LED substrate 8.

Furthermore, terminal portions 8c1 and 8c2 are provided respectively on the back surface 8b of the LED substrate 8 at the left end and the right end that are parallel to each other. These terminal portions 8c1 and 8c2 are electrically connected to the LED drivers 11 through a printed circuit (not shown). Further, the terminal portions 8c1 and 8c2 are electronically connected to the light-emitting diodes 9 directly through holes or the like or indirectly through the LED drivers 11. To the LED substrate 8, an instruction signal is inputted from the illumination control portion (described later) through the terminal portions 8c1 and 8c2 and also power is supplied from a power supply (not shown).

Further, as shown in FIG. 5C, the light-emitting diodes 9 and the LED drivers 11 are placed on the LED substrate 8 so as to stick out respectively from the mounting surface 8a and the back surface 8b. With the use of solder, these light-emitting diodes 9 and LED drivers 11 are respectively fixed to and mounted on printed circuits provided on the corresponding mounting surface 8a and the back surface 8b.

For example, metal having a high heat conductivity such as aluminum is used for the chassis 7, so that heat generated by the light-emitting diodes 9 can be dissipated to the outside. Specifically, as shown in FIG. 6, the chassis 7 includes a frame 7a forming the side walls of the chassis 7, and a flat baseplate 7b provided integrally with the frame 7a so as to close one end side (lower side) of the frame 7a. Further, the chassis 7 includes support portions 7c1 and 7c2 for supporting the LED substrates 8, connecting portions 7d for electrically connecting two horizontally adjacent LED substrates 8 with each other and connecting portions 7e for electrically connecting the LED substrates 8, the illumination control portion 17 and the power supply with each other. Further, the chassis 7 includes six rows of grooves 7f formed in parallel to the horizontal direction and three rows of grooves 7g formed in parallel to the vertical direction. Twelve connecting portions 7d and six connecting portions 7e are integrally placed on the baseplate 7b at intersections of the grooves 7f and 7g.

Specifically, the thickness and the material of the baseplate 7b of the chassis 7 are determined so as to provide the baseplate 7b with desired rigidity (strength), and the rectangular support portions 7c1 and 7c2 are fixed to the baseplate 7b. Further, the surface area of each support portion 7c1 facing the light-emitting surface side (upper side) is about twice as large as the surface area of each support portion 7c2, and the support portions 7c1 each support two vertically adjacent LED substrates 8. On the other hand, the support portions 7c2 on the top row and on the bottom row each support the LED substrates 8 on the top row and the bottom row. Furthermore, the grooves 7f are each formed on the chassis 7 between two vertically adjacent support portions 7c1 and between the support portion 7c1 and the support portion 7c2 vertically adjacent to each other. The LED substrates 8 are supported by corresponding support portions 7c1 and 7c2 with the LED drivers 11 being placed in the grooves 7f.

That is, as shown in FIG. 7A, the LED substrates 8 are placed on and supported by the support portions 7c1 and 7c2 through the heat transfer tape 12 in a state where the LED drivers 11 are contained in the grooves 7f. Further, since the heat transfer tape 12 is provided with not only heat conductivity but also elasticity, the heat transfer tape 12 improves the contact between the radiation patterns 10 of the LED substrates 8 and the support portions 7c1 and 7c2. Furthermore, since the both surfaces, i.e., the surface facing the LED substrates 8 and the surface facing the support portions 7c1 and 7c2, of the heat transfer tape 12 are provided with adhesion, the back surfaces 8b of the LED substrates 8 and the surfaces of the support portions 7c1 and 7c2 can maintain surface-to-surface contact with the respective surfaces of the heat transfer tape 12 with certainty and stability.

As described above, the heat transfer tape 12 improves the contact between the LED substrates 8 and the chassis 7 so that surface-to-surface contact between the LED substrates 8 and the chassis 7 can be maintained with certainty and stability. Thus, in the illumination device 4 of the present embodiment, it is possible to prevent, as much as possible, the efficiency of heat conduction from the LED substrate 8 side to the chassis side brought by the heat transfer tape 12 from declining. As a result, in the illumination device 4 of the present embodiment, heat generated by the light-emitting diodes 9 can be dissipated to the outside of the chassis 7 with speed and more efficiency through the radiation patterns 10, the heat transfer tape 12, the support portions 7c1 and 7c2 and the baseplate 7b. Therefore, in the illumination device 4 of the present embodiment, variations in the light-emitting amount of the light-emitting diodes 9 due to changes in ambient temperature can be prevented. Thus, the illumination device 4 with excellent light-emitting quality can be achieved with ease.

It is to be noted that instead of using the heat transfer tape 12 as in the above description, the radiation patterns 10 of the LED substrates 8 and the support portions 7c1 and 7c2 of the chassis 7 may be brought into contact with each other directly. Further, instead of using the heat transfer tape 12, an adhesive with heat conductivity that becomes a rubber elastic body after being cured may also be used. Further, a heatsink, for example, may be provided on the baseplate 7b of the chassis 7 to enhance the radiation capability of the chassis 7 or a radiation mechanism for forcefully cooling off the heat from the light-emitting diodes, such as a fan or a water jacket in which water (cooling medium) is circulated may be provided on the back of the baseplate 7b.

Further, each of the twelve connecting portions 7d is attached to the baseplate 7b of the chassis 7 integrally so as to be disposed between two horizontally adjacent LED substrates 8. That is, as shown in FIG. 6, among the three rows of grooves 7g formed in parallel to the horizontal direction, six connecting portions 7d are arranged in line at a predetermined spacing in the grooves 7g on the left side and the center of the drawing.

Further, as shown in FIG. 7B, each of the connecting portions 7d is provided with a metal film 7d1 that conducts electricity by coming into contact with the terminal portion 8c2 of the LED substrate 8 and a supporting member 7d2 composed of an elastic body such as a rubber material and being integrated with the metal film 7d1 to support the metal film 7d1. Further, the supporting members 7d2 are attached to the baseplate 7b by fixing means (not shown) such as a screw or an adhesive, and each connecting portion 7d is attached to the baseplate 7d of the chassis 7 integrally in an elastically deformable state.

Furthermore, each connecting portion 7d can electrically connect two horizontally adjacent LED substrates 8 with each other by the terminal portions 8c1 and 8c2 of the LED substrates 8 being placed on the metal film 7d1. Consequently, in the illumination device 4 of the present embodiment, since the LED substrates 8 can be attached to the chassis 7 with ease and high precision, the productivity of the illumination device 4 can be increased. Moreover, in the illumination device 4 of the present embodiment, the LED substrates 8 are connected to each other electrically without using an electric wiring such as FPC or a connector for connecting the LED substrates. Thus, as shown in FIG. 4, a plurality of the LED substrates 8 can be contained in the chassis 7 without creating dead space, and an increase in size of the illumination device 4 can be prevented with ease.

Further, six connecting portions 7e are arranged in the groove 7g on the right side of FIG. 6 in line at a predetermined spacing. Similarly to the connecting portions 7d, each connecting portion 7e is attached to the baseplate 7b of the chassis 7 integrally in an electrically insulated state from the frame 7a and the baseplate 7b and also in an elastically deformable state against the baseplate 7b. Further, to each connecting portion 7e, one end of an FPC (not shown) whose other end is connected to the illumination control portion described later and to the power supply is connected electrically, so that the instruction signal is inputted to and power is supply to the LED substrates 8.

As described above, since the connecting portions 7d and 7e are placed on the chassis 7 integrally in an elastically deformable state, they can be connected electrically to the terminal portions 8c1 and 8c2 with more certainty. Further, each of the connecting portions 7d and 7e is elastically deformable against the chassis 7. Thus, even when the LED substrates 8 are fixed to the chassis 7 by the fixing means such as a screw, the vertical positions from the baseplate 7b of the chassis 7 of the LED substrates 8 to be connected through the connecting portions 7d and 7e can be easily adjusted to a predetermined value. As a result, in the illumination device 4 of the present embodiment, it is possible to improve the precision at the time of attaching the LED substrates 8 to the chassis 7 with ease.

It is to be noted that instead of using the connecting portions 7d and 7e as in the above description, connecting members that are removable from the chassis 7 can be used. Further, without using the connecting portions, two LED substrates can be connected to each other electrically by forming terminal portions on both the mounting surface 8a side and the back surface 8b side of the LED substrates 8.

Next, the backlight scan drive and the area active backlight drive in the liquid crystal display device 1 of the present embodiment will be described in detail with reference to FIGS. 8 to 11.

Figure 8:
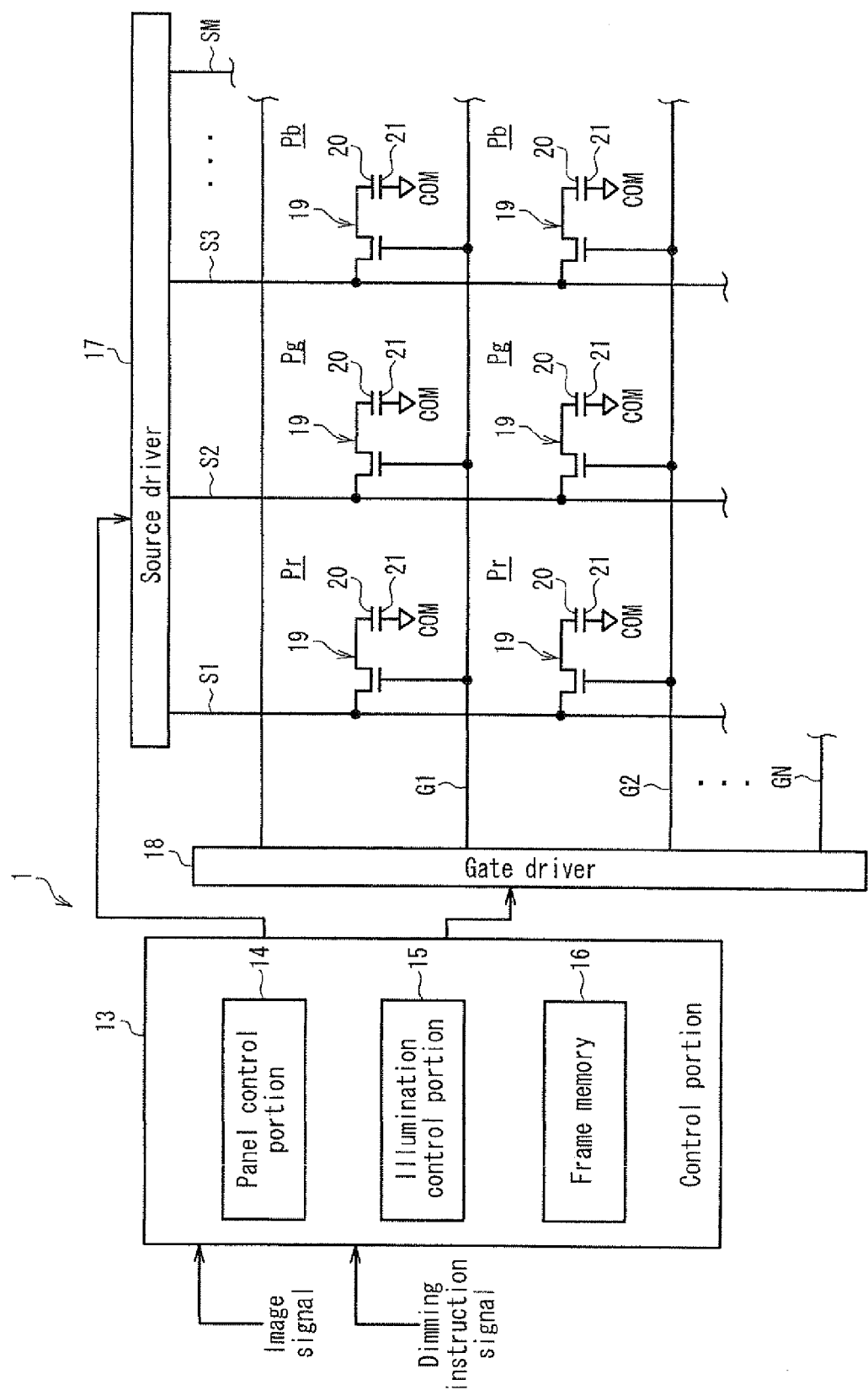
FIG. 8 is a diagram for explaining main components of the liquid crystal display device.
Figure 9:
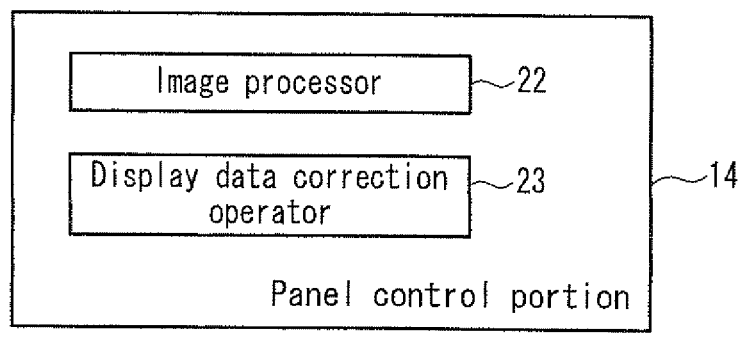
FIG. 9 is a block diagram showing a configuration example of the panel control portion shown in FIG. 8.
Figure 10:
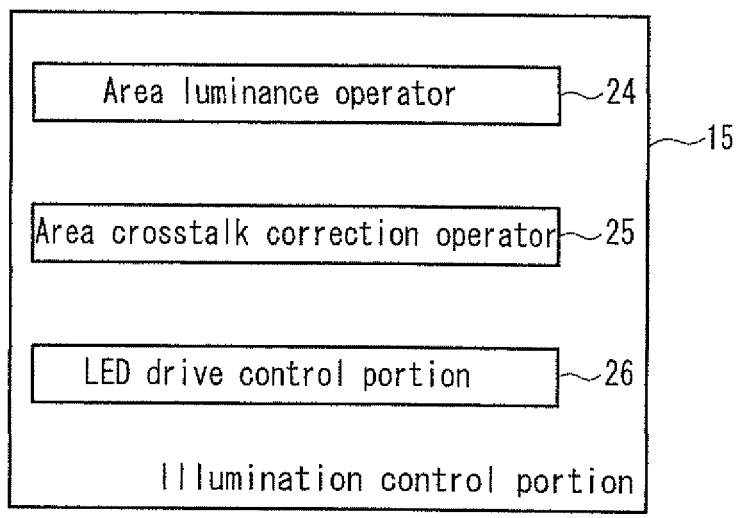
FIG. 10 is a block diagram showing a configuration example of the illumination control portion shown in FIG. 8.
Figure 11:
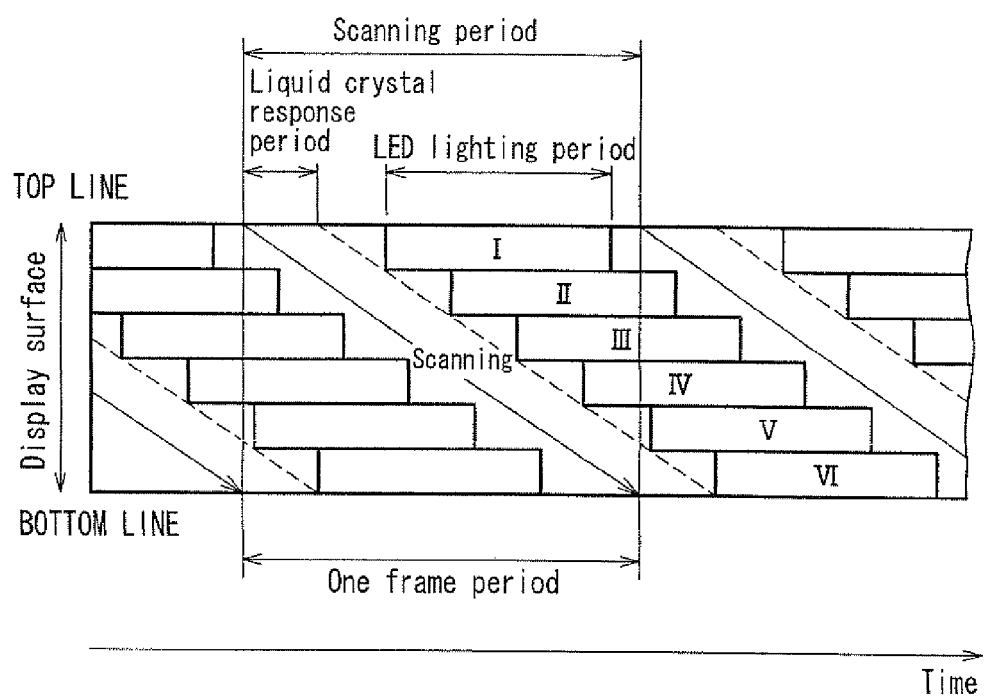
FIG. 11 is a timing chart showing the operation of each portion of the liquid crystal display device.

FIG. 8 is a diagram for explaining main components of the liquid crystal display device 1. FIG. 9 is a block diagram showing a configuration example of the panel control portion shown in FIG. 8. FIG. 10 is a block diagram showing a configuration example of the illumination control portion shown in FIG. 8. FIG. 11 is a timing chart showing the operation of each portion of the liquid, crystal display device 1.

In FIG. 8, an image signal is inputted to a control portion 13 from the outside of the liquid crystal display device 1 through a signal source (not shown) such as a television (receiver) or a personal computer. Further, the control portion 13 substantially drives the liquid crystal panel 3 using the inputted image signal. Furthermore, the control portion 13 substantially drives also the illumination device 4 using the inputted image signal.

Specifically, the control portion 13 includes a panel control portion 14 for driving the liquid crystal panel 3 by the pixel using the image signal, an illumination control portion 15 for driving each light-emitting diode 9 of the illumination device 4 using the image signal, and a frame memory 16 capable of storing frame-by-frame display data contained in the image signal. Further, a dimming instruction signal is inputted to the control portion 13 from a remote controller (not shown) or the like associated with the liquid crystal display device 1. On the basis of the inputted dimming instruction signal, the illumination control portion 15 changes power supply to the light-emitting diodes 9.

Further, the panel control portion 14 outputs instruction signals to a source driver 17 and a gate driver 18. Furthermore, the luminance value of each illumination area ba is notified to the panel control portion 14 from an area crosstalk correction portion (described later) provided in the illumination control portion 15. Thus, the instruction signal to the source driver 17 is outputted from the panel control portion 14 to the source driver 17 after being corrected to reflect the notified luminance value of each illumination area ha.

The source driver 17 and the gate driver 18 are driving circuits for driving a plurality of pixels provided in the liquid crystal panel 3 by the pixel. A plurality of signal lines S1 to SM is an integer greater than or equal to 2) are connected to the source driver 17 and a plurality of control lines G1 to GN (N is an integer greater than or equal to 2) are connected to the gate driver 18. These signal lines S1 to SM and control lines G1 to GN are disposed in a matrix and pixel regions are formed in respective pieces of the area partitioned in a matrix by the signal and control lines. Further, the plurality of pixels include red pixels Pr, green pixels Pg and blue pixels Pb. The red pixels Pr, the green pixels Pg and the blue pixels Pb are disposed successively this order, for example, in parallel to the control lines G1 to GN.

A switching element 19 is provided in each pixel and the gate of the switching element 19 is connected to each of the control lines G1 to GN. On the other hand, the source of the switching element 19 is connected to each of the signal lines S1 to SM. Further, a pixel electrode 20 provided in each pixel is connected to the drain of each switching element 19. In each pixel, a common electrode 21 is disposed so as to face the pixel electrode 20 with the above-mentioned liquid crystal layer provided on the liquid crystal panel 3 being interposed therebetween.

Also with reference to FIG. 9, the panel control portion 14 is provided with an image processor 22 and a display data correction operator 23, and they respectively generate instruction signals to the source driver 17 and the gate driver 18 using the inputted image signal. That is, the image processor 22 generates an instruction signal to the gate driver 18 on the basis of the display data of the image signal stored in the frame memory 16 and outputs the signal to the gate driver 18. On the basis of the instruction signal from the image processor 22, the gate driver 18 sequentially outputs to the control lines G1 to GN gate signals for turning on the gate of the corresponding switching element 19. Further, the image processor 22 generates an instruction signal to the source driver 17 on the basis of the display data and outputs the signal to the display data correction operator 23.

To the display data correction operator 23, not only the instruction signal from the image processor 22 to the source driver 17 but also the luminance value of each illumination area ba is inputted from the area crosstalk correction portion. These luminance values of the illumination areas ba have been corrected with the use of a crosstalk value described later and the influence of crosstalk of light from the surrounding illumination areas ba is taken into consideration. With the use of the luminance value of each illumination area ha, the display data correction operator 23 corrects the instruction signal to the source driver 17 by the pixel to generate a new instruction signal and outputs the new instruction signal to the source driver 17. Thus, the source driver 17 appropriately outputs to the signal lines S1 to SM voltage signals (gradation voltage) that specify the luminance (gradation) of information to be displayed on the display surface.

Also with reference to FIG. 10, the illumination control portion 15 is provided with an area luminance operator 24, an area crosstalk correction portion 25 and an LED driving control portion 26. The illumination control portion 15 drives the six rows of LED substrate groups to illuminate in sequence in accordance with an image signal to be inputted thereto (described later in detail).

By the illumination area ba, the area luminance operator 24 obtains luminance information on the pixels included in the corresponding display area pa from the inputted image signal. Further, with the use of the obtained luminance information on the pixels, the area luminance operator 24 determines red, green and blue luminance values of each illumination area ba by operation (luminance operation process). Further, the area luminance operator 24 outputs the determined red, green and blue luminance values of each illumination area ba to the area crosstalk correction portion 25.

The red, green and blue luminance values of each illumination area ba from the area luminance operator 24 are inputted to the area crosstalk correction portion 25. Further, by the illumination area ba, the area crosstalk correction portion 25 determines the crosstalk value of light that enters the corresponding display area pa from the surrounding illumination areas ba and corrects each luminance value of the plurality of illumination areas ba on the basis of the determined crosstalk value (area crosstalk correction process). Furthermore, the area crosstalk correction portion 25 performs the area crosstalk correction process for each color of red, green and blue.

The LED driving control portion 26 performs the backlight scan drive in which the plurality of illumination areas ba are illuminated in sequence in accordance with the information displayed on the liquid crystal panel 3. In the backlight scan drive, in order to allow the plurality of illumination areas ba to emit light in sequence in a predetermined lighting direction as well as to allow each illumination area ba to emit light concurrently with at least one of the adjacent illumination areas ba in the lighting direction during a predetermined overlap period, the corresponding light-emitting diodes 9 are illuminated in sequence. Thus, in the illumination device 4 of the present embodiment, the backlight scan drive and the area active backlight drive are performed at the same time.

Specifically, in the illumination device 4 of the present embodiment, as I to VI shown in FIG. 11 indicate, the six rows of LED substrate groups in which horizontally adjacent LED substrates 8 are connected electrically to each other are illuminated in sequence along the vertical direction of the display surface as the lighting direction. Further, each LED substrate group is set to illuminate at the same LED lighting period and during the above-mentioned overlap period, each LED substrate group is set to illuminate concurrently with the vertically adjacent LED substrate groups.

In other words, in the illumination device 4 of the present embodiment, among the light-emitting diodes 9 shown in FIG. 4, 36 light-emitting diodes 9 mounted on the three LED substrates 8 placed on the top row illuminate at the same time. Thus, from the illumination areas 1-1 . . . 1-9 (FIG. 3) corresponding to these light-emitting diodes 9, illumination light is emitted to the corresponding display areas (1) . . . (9) (FIG. 3) at the same time. Then, while the illumination light is emitted from the illumination areas 1-1 . . . 1-9, 36 light-emitting diodes 9 mounted on the three LED substrates 8 on the second row from the top illuminate at the same time. Thus, illumination light is emitted from the illumination areas 2-1 . . . 2-9 (FIG. 3) to the corresponding display areas (10) . . . (18) (FIG. 3) at the same time. Thereafter, at the timing indicated by the LED lighting period shown in FIG. 11, the illumination areas ba formed in parallel to the horizontal direction of the display surface emit light at the same time and irradiate the corresponding display areas pa with the illumination light.

Further, in the illumination device 4 of the present embodiment, one frame period and a scanning period are set to have the same time interval and a liquid crystal response period and a LED lighting period are set in one frame period. Further, in the illumination device 4 of the present embodiment, all the light-emitting diodes 9 are turned off during the periods other then the LED lighting period and a black insertion period is provided. During the black insertion period, the display areas pa of the display surface display with a black gradation in sequence in accordance with the light-off operation of the illumination areas ba. As a result, in the liquid crystal display device 1 of the present embodiment, it is possible to prevent deterioration in the display quality with certainty even when displaying moving images.

In the illumination device 4 of the present embodiment configured in the above manner, the plurality of light-emitting diodes (light-emitting elements) 9 and the plurality of LED drivers (driving circuit elements) 11 are provided respectively on the mounting surface 8a and the back surface 8b of each LED substrate (light source substrate) 8 in a distributed manner. Thus, unlike the above-mentioned conventional illumination device, it is possible to prevent, in the illumination device 4 of the present embodiment, heat generated by the light-emitting diodes 9 and heat generated by the LED drivers 11 from interacting with each other even when the number of the light-emitting diodes 9 to be placed is increased. Consequently, unlike the conventional illumination device, the illumination device 4 of the present embodiment prevents an increase in ambient temperature of the plurality of light-emitting diodes 9 due to the heat from the LED drivers 11, so that a decline in the light-emitting efficiency of each light-emitting diode 9 can be prevented. Therefore, in the present embodiment, the light-emitting quality of the illumination device 4 can be improved.

Further, in the present embodiment, the illumination device 4 whose light-emitting quality can be improved even when the number of the light-emitting diodes 9 to be placed is increased has been used. Thus, it is possible to achieve the high-performance liquid crystal display device 1 with high luminance and excellent display quality with ease.

Further, in the present embodiment, heat generated by each light-emitting diode 9 is transferred efficiently from the mounting surface 8a side to the chassis 7 side by placing the radiation patterns 10 on the back surface 8b of each LED substrate 8 by the light-emitting diode 9. Thus, it is possible to dissipate the heat from each light-emitting diode 9 to the outside with efficiency. As a result, in the present embodiment, the light-emitting quality of the illumination device 4 can be improved with ease. Further, since the radiation patterns 10 are provided by the light-emitting diode 9, even when the six rows of LED substrate groups are illuminated in sequence as shown in FIG. 11, heat generated by the light-emitting diodes 9 included in each row of light-emitting diodes can be dissipated appropriately. As a result, even when performing the backlight scan drive and the area active backlight drive at the same time, the plurality of light-emitting diodes 9 can be operated stably, and thereby deterioration in the light-emitting quality can be prevented.

The above embodiment is shown merely for an illustrative purpose and is not limiting. The technical range of the present invention is defined by the claims, and all the changes within a range equivalent to the configuration recited in the claims also are included in the technical range of the present invention.

For example, although the case where the present invention is applied to a transmissive liquid crystal display device has been described above, the application of the illumination device of the present invention is not limited to this type. For example, the illumination device of the present invention can be applied to a variety of display devices including a non-luminous display portion that utilizes light from a light source to display information such as images and texts. More specifically, the illumination device of the present invention can be preferably applied to a semi-transmissive liquid crystal display device and a projection type display device such as a rear projector in which light bulbs are used in the liquid crystal panel.

In addition to the examples described above, the present invention can be preferably applied to an X illuminator used to irradiate x-ray radiographs with light, a light box that irradiates negative images or the like with light to make them more visually identifiable or an illumination device of a light-emitting device for illuminating billboards or ads placed on walls in station premises.

Further, the case of using the LED substrates each provided with two rows of light-emitting diodes including six light-emitting diodes arranged in line and the six rows of LED substrate groups each group composed of three LED substrates arranged in line and electrically connected to each other has been described above. However, in terms of the configuration of the light source substrates (including the placing number and the type of light-emitting elements), the number of the light source substrates to be placed and the connection method, the present invention is not limited to the above configuration in anyway so long as driving circuit elements for driving light-emitting elements are provided on the backside of a mounting surface of a light source substrate on which a plurality of light-emitting elements are provided of the mounting surface.

However, when mounting a plurality of rows of light-emitting elements on the mounting surface of the light source substrate as in the above embodiment, in terms of preventing heat generated by the light-emitting elements and heat generated by the driving circuit elements from interacting with each other with more certainty and improving the light-emitting quality of the illumination device with ease, it is preferable to place the driving circuit elements on the backside of the mounting surface so as to be disposed between the plurality of rows of light-emitting elements. Further, when mounting only one row of light-emitting elements on the mounting surface, it is preferable to mount the driving circuit elements on the backside at the portions other than those directly under the light-emitting elements included in the row of light-emitting elements, so that the radiation patterns can be placed on the portions directly under the corresponding light-emitting diodes.

Further, as in the embodiment described above, it is preferable to use light-emitting diodes for the light-emitting elements because an illumination device with low power consumption and excellent eco-friendliness can be achieved with ease.

Further, the case of using the plurality of 3-in-1 light-emitting diodes including R, G and B light-emitting diodes has been described above. However, light-emitting diodes that can be used in the present invention are not limited to this type and individual R, G and B light-emitting diodes, white (W) light-emitting diodes that emit white light or so-called 4-in-1 light-emitting diodes including four light-emitting diodes such as R, G, B and W or G, R, G and B may also be used. Further, light-emitting diodes other than R, G, B and W may also be added. In this case, although it is necessary to add colors to the pixels of the liquid crystal panel, a wider range of colors can be reproduced. Examples of the colors to be added include yellow and magenta.

However, as in the above embodiment, it is preferable to use a plurality of types (e.g., RGB) of light-emitting diodes whose emission light colors are different from each other but they can be mixed into white light than to use white light-emitting diodes in terms of improving the color purities of the corresponding emission colors of the plurality of types of light-emitting diodes. Furthermore, an illumination device with excellent light-emitting quality and, by extension, a display device with excellent display quality can be achieved with ease.

The case of achieving a direct-type illumination device has been described above. However, the application of the present invention is not limited to this type and can be applied to an edge-light type illumination device in which a single light guiding plate is placed on the lower side of the light-emitting surface of the illumination device and a plurality of light source substrates are arranged in parallel to at least one of the four sides surrounding the light guiding plate or to other type of illumination device such as a tandem-type illumination device in which light guiding plates are provided by the light-emitting element. Further, even when applying the present invention to a tandem-type illumination device in which optical components such as light guiding plates need to be placed on the mounting surface of a light source substrate, electronic components other than light-emitting elements, such as the above-mentioned connector, are not placed on the mounting surface of the light source substrate, as shown in FIG. 5. Thus, the optical components can be placed easily and the thickness of the illumination device can be reduced with ease.

In addition to the examples described above, the present invention can also be applied to, for example, an illumination device having a configuration in which a light-emitting amount of light-emitting elements included in a plurality of illumination areas is set by the illumination area in accordance with an image signal to be inputted and capable of performing whole area collective flash drive in which all the light-emitting elements can be illuminated or turned off at the same time or to an illumination device capable of illuminating, among a plurality of light-emitting elements arranged in line on a light source substrate, two adjacent light-emitting elements in a state where PWM dimming on/off phases of the two adjacent light-emitting elements are shifted from each other so as to prevent the occurrence of flicker or unevenness in luminance.

INDUSTRIAL APPLICABILITY

The present invention is useful for an illumination device whose light-emitting quality can be improved even when the number of light-emitting elements to be placed is increased and a high-performance display device using the illumination device.

The invention claimed is:

1. An illumination device comprising:
a light source substrate including a mounting surface,
wherein a plurality of light-emitting elements are provided on the mounting surface of the light source substrate,
a driving circuit element for driving the light-emitting elements is provided on a backside of the mounting surface,
wherein a plurality of rows of light-emitting elements are provided on the mounting surface of the light source substrate, the plurality of rows of light-emitting elements including the plurality of light-emitting elements arranged along a predetermined direction at a predetermined spacing,
the driving circuit element for driving the light-emitting elements is provided on the backside of the mounting surface so as to be disposed between the plurality of rows of light-emitting elements,
a chassis for containing the light source substrate,
a radiation portion for dissipating heat generated by the light-emitting diodes is provided on the backside of the light source substrate, and heat from the radiation portion is dissipated to outside through the chassis, and
wherein the driving circuit element is provided at least in a groove which is formed with support portions which are formed between the chassis and the radiation portion.

2. The illumination device according to claim 1, wherein a heat transfer member is provided between the chassis and the radiation portion.

3. The illumination device according to claim 2, wherein the heat transfer member is provided with elasticity.

4. The illumination device according to claim 2, wherein the heat transfer member is provided with adhesion.

5. The illumination device according to claim 1, wherein the light-emitting elements are light-emitting diodes.

6. The illumination device according to claim 1, wherein a plurality of types of light-emitting diodes whose emission light colors are different from each other but can be mixed into white light are used for the light-emitting elements.

7. The illumination device according to claim 1, wherein a plurality of types of light-emitting diodes whose emission light colors are different from each other are used for the light-emitting elements, a plurality of sets of light-emitting diodes whose emission light colors can be mixed into white light are included, and
the plurality of sets of light-emitting diodes are placed on the mounting surface along the predetermined direction and at a predetermined spacing.

8. A display device comprising a display portion,
wherein, the display portion is irradiated with light by the illumination device according to claim 1.

* * * * *